United States Patent
Volkerink et al.

(10) Patent No.: US 7,386,777 B2
(45) Date of Patent: Jun. 10, 2008

(54) SYSTEMS AND METHODS FOR PROCESSING AUTOMATICALLY GENERATED TEST PATTERNS

(75) Inventors: Erik H. Volkerink, San Jose, CA (US); Klaus-Dieter Hilliges, Mountain View, CA (US)

(73) Assignee: Verigy (Singapore) Pte. Ltd., Singapore (SG)

( * ) Notice: Subject to any disclaimer, the term of this patent is extended or adjusted under 35 U.S.C. 154(b) by 333 days.

(21) Appl. No.: 10/818,101

(22) Filed: Apr. 5, 2004

(65) Prior Publication Data

US 2005/0229062 A1 Oct. 13, 2005

(51) Int. Cl.
G01R 31/28 (2006.01)
(52) U.S. Cl. .................... 714/738; 714/728
(58) Field of Classification Search ............ 716/4; 714/729, 726
See application file for complete search history.

(56) References Cited

U.S. PATENT DOCUMENTS

| | | | |
|---|---|---|---|
| 4,679,094 A * | 7/1987 | Rutherford et al. .... | 358/426.09 |
| 5,499,248 A | 3/1996 | Behrens et al. | |
| 5,991,909 A * | 11/1999 | Rajski et al. ............. | 714/729 |
| 6,661,839 B1 * | 12/2003 | Ishida et al. ............. | 375/240 |
| 6,684,358 B1 | 1/2004 | Rajski et al. | |
| 6,732,312 B2 * | 5/2004 | Khoche et al. ............. | 714/738 |
| 6,757,323 B1 * | 6/2004 | Fleming et al. ............ | 375/142 |
| 6,950,974 B1 * | 9/2005 | Wohl et al. ............... | 714/733 |
| 2002/0053057 A1 * | 5/2002 | Rajski et al. ............. | 714/738 |
| 2002/0093356 A1 * | 7/2002 | Williams et al. ........... | 324/765 |
| 2003/0131298 A1 * | 7/2003 | Rajski et al. ............. | 714/738 |
| 2003/0229838 A1 * | 12/2003 | Hiraide ..................... | 714/738 |
| 2004/0107395 A1 | 6/2004 | Volkerink et al. | |
| 2004/0128599 A1 * | 7/2004 | Rajski et al. ............. | 714/726 |
| 2005/0028060 A1 * | 2/2005 | Dervisoglu et al. ......... | 714/726 |

OTHER PUBLICATIONS

Khoche, Ajay et al., "Test Vector Compression using EDA-ATE Synergies", Apr. 28, 2002 Proceedings 20th IEEE VLSI Test Symposium, pp. 97-102.

* cited by examiner

Primary Examiner—Cynthia Britt
(74) Attorney, Agent, or Firm—Fulbright & Jaworski LLP

(57) ABSTRACT

Representative embodiments are generally directed to storing compressed test pattern data on an automated test equipment (ATE) device. In one embodiment, the test pattern data is compressed according to a linear feedback shift register (LFSR). The LFSR may possess a low probability of occurrence of linear dependencies associated with compression of stimulus patterns to enable relatively highly compacted patterns to be compressed. Additionally or alternatively, repeat-filled test pattern data is run length encoded using variable length code words to facilitate parallel decompression within the ATE device.

25 Claims, 6 Drawing Sheets

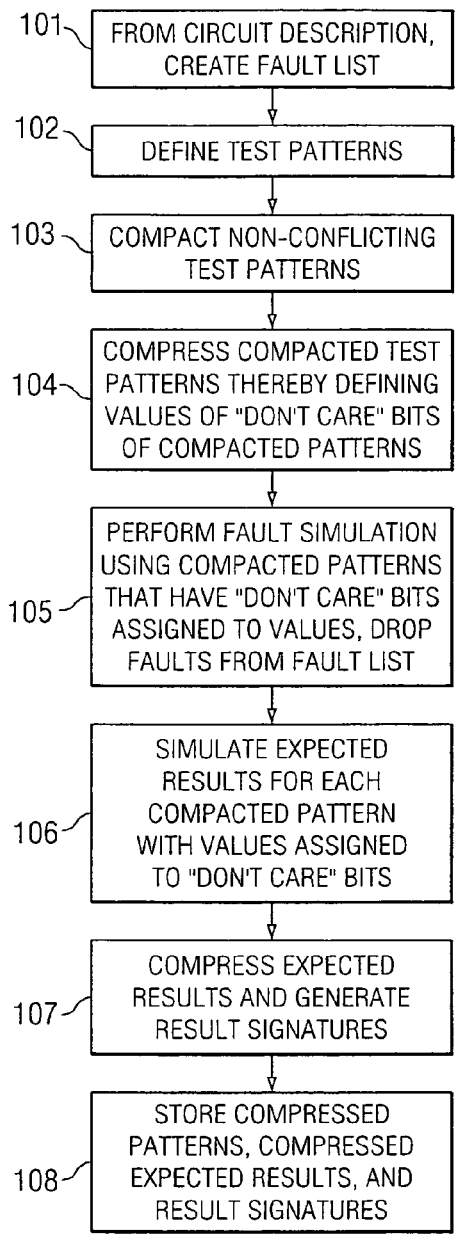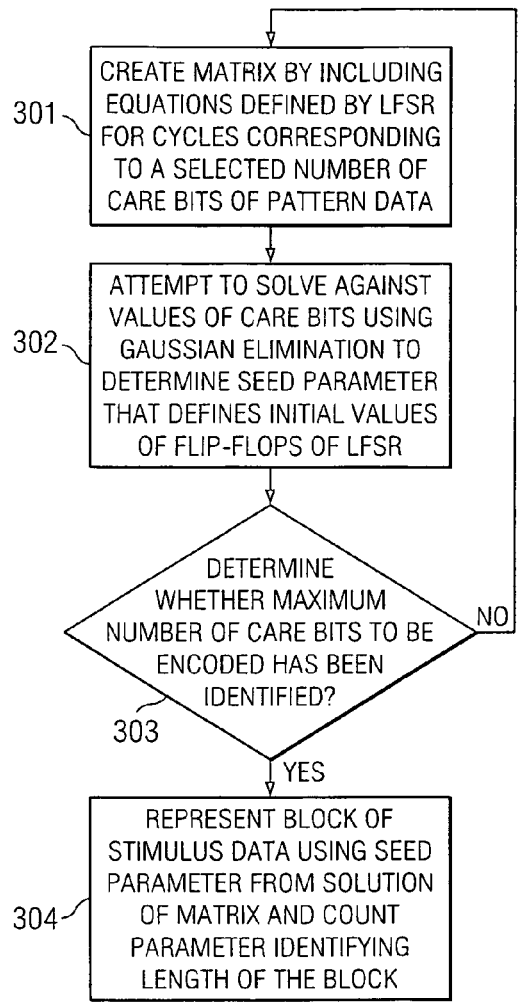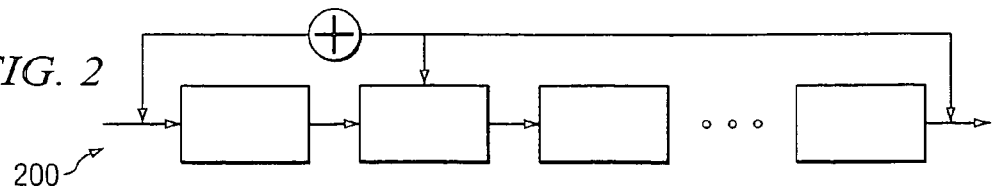

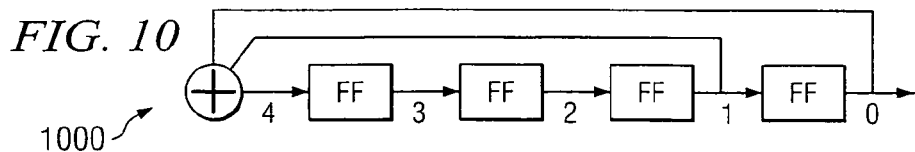
FIG. 10
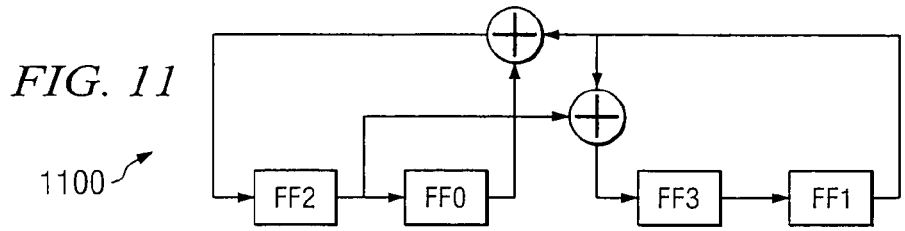
FIG. 11
FIG. 12
$$H = \begin{bmatrix} 0 & 1 & 0 & 0 \\ 0 & 0 & 1 & 0 \\ 0 & 0 & 0 & 1 \\ 1 & 1 & 0 & 0 \end{bmatrix}$$
FIG. 13
$$H^2 = \begin{bmatrix} 0 & 0 & 1 & 0 \\ 0 & 0 & 0 & 1 \\ 1 & 1 & 0 & 0 \\ 0 & 1 & 1 & 0 \end{bmatrix}$$
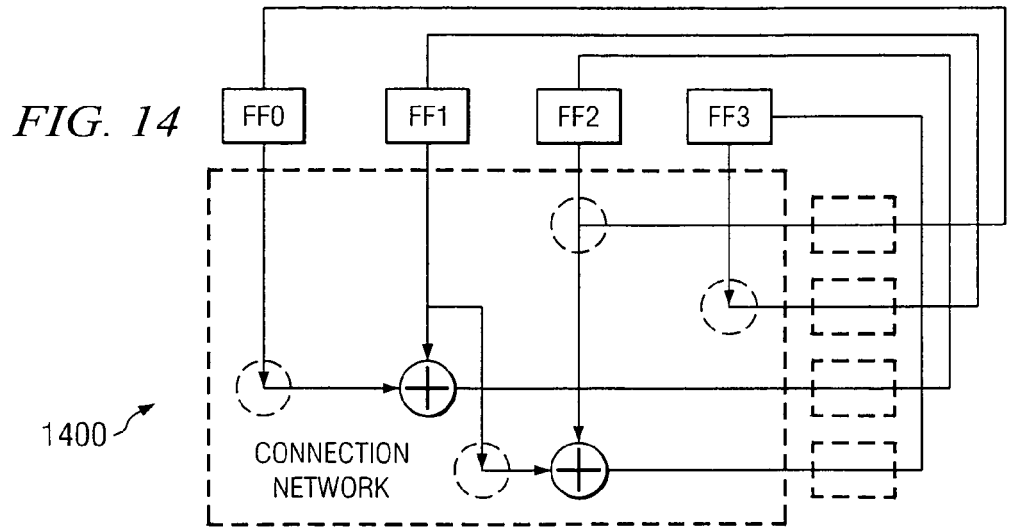
FIG. 14

SYSTEMS AND METHODS FOR PROCESSING AUTOMATICALLY GENERATED TEST PATTERNS

TECHNICAL FIELD

The present invention is directed to processing automatic test pattern generation (ATPG) data in association with an ATE (automated test equipment).

BACKGROUND

Automatic test pattern generation (ATPG) refers to the process in which logical patterns or vectors are generated. The test patterns can be applied to the logic (such as a portion of an integrated circuit) to test the functionality of the logic using internal scan chains. ATPG generally occurs by examining the net list of a circuit and generating a fault list. A fault list is a description of potential faults that can occur in the design and includes all nodes in the circuit. Different fault models can be used, such as the bridging fault model, the transition fault model, and the stuck at fault model. The stuck at fault model is the predominately used model. "Stuck-at-1" means that a certain node is always 1. "Stuck-at-0" means that a certain node is always 0. For example, in case of targeting a stuck-at-0 fault, the pattern will be generated such that a respective node is driven to 1 (also called sensitized) and propagated to an observable output. Based on the observable output, it is determined whether the node is actually driven to 1. If not, then a stuck-at-0 fault is present. To enable a node to be sensitized and propagated, not all bits of a test pattern need to be specified. The specified bits are referred to as "care" bits and the unspecified bits are called "don't care" bits.

Recently, the amount of data required to represent the test patterns in ATPG has increased substantially for a number of reasons. For example, the growing complexity of new fault models and the increasing sophistication of circuits being tested has increased the amount of data required to represent test patterns. Thus, the amount of memory of automatic test equipment (ATE) used to apply test patterns to circuits must be increased to compensate for the increase in test pattern data.

On-chip decompression of test patterns and compression of test results (by, for example, Design-for-Test (DFT) products) have been implemented to address the increase in test pattern data. However, on-chip compression and decompression is problematic for a number of reasons. First, the on-chip compression and decompression require a degree of overhead thereby increasing the size of the die and reducing the throughput. Moreover, increasing the die size results in a rapid reduction in yield (i.e., a larger die is more likely to be defective). Secondly, the on-chip compression and decompression functionality must be designed into the chip and suitably verified in the same manner as any other functional portion of the chip. Accordingly, the on-chip compression and decompression functionality adds a degree of technical risk to chip development that is disadvantageous. Moreover, many of the proposed on-chip compression techniques impact diagnostic capabilities and cannot deal very well with unknown test responses.

SUMMARY

Representative embodiments are directed to systems and methods for compressing and/or decompressing ATPG patterns to facilitate testing of circuits using automatic test equipment (ATE). Moreover, representative embodiments employ compression and decompression algorithms that differ appreciably from compression and decompression algorithms employed by known on-chip techniques. For example, on-chip techniques decompress test data that possesses a relatively low degree of compaction. Specifically, the care bit density is relatively minimal and, hence, the probability of an occurrence of a linear dependency in finding linear feedback shift register (LFSR) seeds is maintained at a relatively low level. Additionally, on-chip compression techniques utilize the data generated by an ATPG tool, i.e., the don't care bits are unspecified. By keeping the don't care bits unspecified, the number of patterns are significantly increased (by two to three times as typically observed for commonly available commercial tools). Each of these factors tends to increase the test time. On-chip techniques rely on fanning out multiple scan chains to prevent an increase in test time from occurring. However, fanning out multiple scan chains is not useful when decompression occurs on the ATE. Thus, employing known algorithms to decompress test data on an ATE would unacceptably increase the amount of test time required for a circuit under test.

In one representative embodiment, an ATE architecture provides sufficient compression/decompression resources to enable test pattern processing to occur on a per pin basis. Specifically, each pertinent pin of the circuit-under-test that receives test patterns or outputs result data may be associated with independent compression/decompression functionality. Accordingly, the decompression and compression may occur in real-time during test of the respective circuit.

In contrast to on-chip compression techniques, representative embodiments utilize relatively larger LFSRs, because the LFSR is implemented on the ATE. In contrast to on-chip techniques, representative embodiments utilize an architecture for an "over-clocking" linear feedback shift register (LFSR) that is characterized by a potentially non-primitive polynomial. The resulting freedom in selecting taps and the length of the LFSR are used to significantly reduce the linear dependency probability. Accordingly, representative embodiments enable relatively highly compacted test data to be decompressed by an ATE in real-time during operation of the ATE. By enabling compacted test data to be used, test time is maintained at acceptable levels. Additionally, high compression ratios can be obtained, because the larger LFSR enables the overhead associated with the count bits to become negligible.

In another representative embodiment, the don't care bits of stimulus patterns are repeat filled, e.g., each consecutive bit in a run (a plural number of consecutive occurrences) of don't care bits are assigned the value of the care bit that immediately precedes the run. After repeat filling, the stimulus patterns are run length encoded using, for example, variable length code words such as Fibonacci codes to enable high speed decompression. Specifically, a decompression architecture is employed that uses a plural number of run length decoders to perform decompression in parallel to satisfy the relatively demanding timing criteria associated with ATE.

DESCRIPTION OF THE DRAWINGS

FIG. 1 depicts a flowchart for processing test data according to one representative embodiment.

FIG. 2 depicts a linear feedback shift register.

FIG. 3 depicts a flowchart for encoding test data using SEED and COUNT parameters according to one representative embodiment.

FIG. 10 depicts an LFSR.

FIG. 11 depicts a "two-times" over-clocking LFSR derived from the LFSR shown in FIG. 10.

FIG. 12 depicts a matrix defined by the LFSR shown in FIG. 10.

FIG. 13 depicts a matrix characterizing the LFSR shown in FIG. 11 that is derived from the matrix shown in FIG. 12.

FIG. 14 depicts a connection network for an LFSR as defined by the matrix shown in FIG. 13.

DETAILED DESCRIPTION

Figure 4:
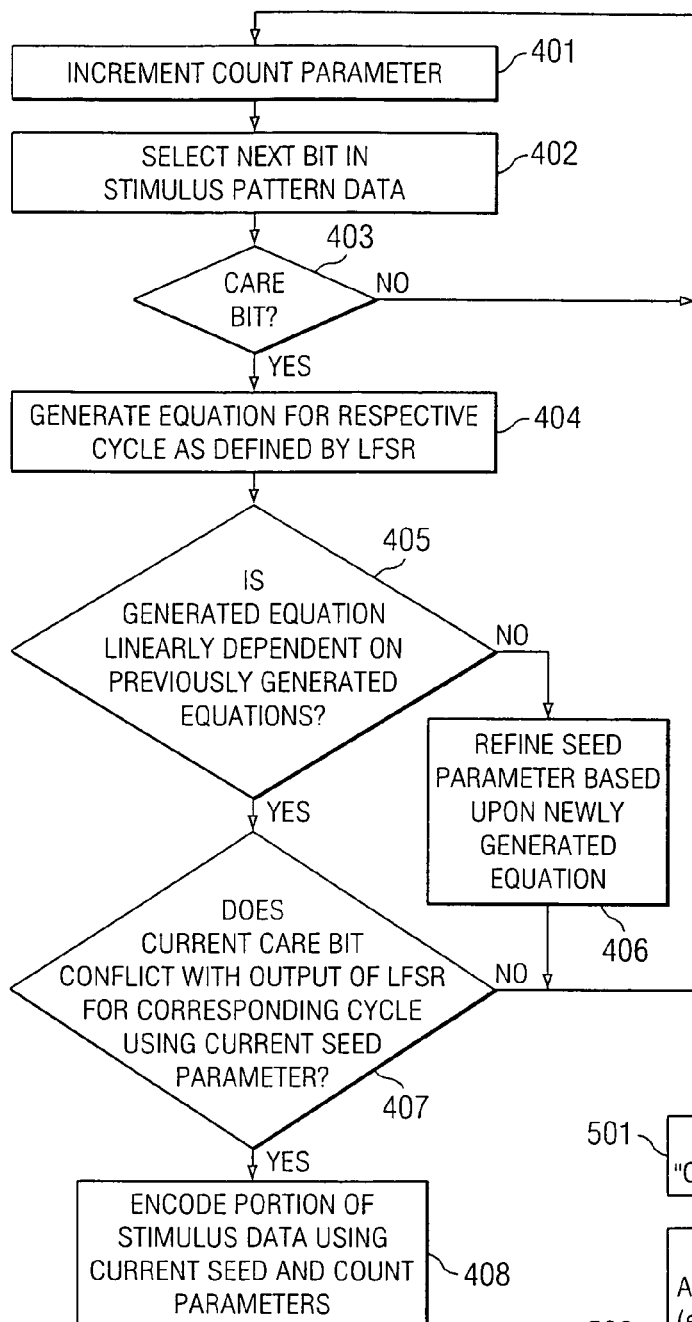
FIG. 4 depicts another flowchart for encoding test data using SEED and COUNT parameters according to one representative embodiment.

One representative embodiment employs an "over-clocking" architecture for an LFSR that enables relatively compacted test patterns to be compressed for subsequent decompression on an ATE in real-time during testing of a circuit under test. An example of an "over-clocking" architecture is shown in FIG. 12 which is discussed in greater detail below. The architecture differs from LFSR architectures used by on-chip techniques by using a relatively large LFSR that is characterized by a polynomial that is not necessarily primitive. Furthermore, LFSRs according to one representative embodiment may include feedforward and feedback taps. The resulting freedom in selecting the taps is used to significantly reduce the linear dependency probability between LFSR cycles that tends to limit the achieved amount of compression. By enabling a greater amount of compaction of test patterns, representative embodiments maintain the amount of time required to test a circuit by an ATE within acceptable levels.

In another representative embodiment, compression of test data may occur by repeat filling runs of don't care bits in stimulus patterns. After the repeat filling is performed, run length encoding is performed. One representative embodiment replaces runs of binary symbols with modified Fibonacci codes. The modified Fibonacci codes identify the beginning and ending of each code without requiring the individual run lengths to be decoded. One representative embodiment uses the ability to detect each code to decompress test data in parallel using a plural number of run length decoders. By serializing the output bits from each run length decoder, a data stream of a sufficient bit rate is obtained that enables real-time decompression of test data for application to a circuit under test by an ATE.

FIG. 1 depicts a flowchart that illustrates integration of LFSR compression and run length compression with automated test pattern generation according to representative embodiments. In step 101, from a logical or other suitable circuit description (e.g., a circuit description generated utilizing a suitable design tool), a fault list is created. From step 102, test patterns are defined. Each symbol in the patterns is represented by one of the three following states: "0," "1," and "X." When the symbol reflects the "0" state, the respective bit must be set to zero to test the fault that corresponds to the stimulus pattern due to the logic of the circuit design. Likewise, when the symbol reflects the "1" state, the respective bit must be set to one to test the fault that corresponds to the stimulus pattern. Bits corresponding to the "0" and "1" states are referred to as care bits. When the symbol reflects the "X" state, the respective bit may be set to either zero or one to test the fault that corresponds to the stimulus pattern. Bits corresponding to the "X" state are referred to as don't care bits. In step 103, non-conflicting stimulus patterns are repetitively compacted. Specifically, stimulus patterns that do not possess care bits that have conflicting values may be combined into a single compacted pattern. Steps 101-103 may be performed using known algorithms such as those employed by known ATPG software tools.

In step 104, the compacted stimulus patterns are compressed according to representative embodiments. In one representative embodiment, step 104 is performed using an LFSR algorithm. Specifically, the output of an LFSR for each cycle of operation defines a linear equation. A set of linear equations is generated to correspond to respective output cycles of the LFSR that are associated with care bits of stimulus patterns to be compressed. The set of linear equations is solved against the logical values of the care bits to determine the initial state of the LFSR that will cause the LFSR to reproduce the care bits.

As previously discussed, one representative embodiment employs an LFSR possessing a relatively large length and a non-primitive polynomial. Furthermore, the LFSR may possess feedforward and feedback taps. By providing a degree of freedom to the selection of the taps, the probability of the occurrence of multiple linear equations in the set being linear dependent is appreciably reduced. By reducing the probability, a greater density of care bits may be encoded thereby enabling relatively highly compacted test patters to be compressed.

The compression may occur by dividing the stimulus patterns into blocks. For each block, a "SEED" parameter and a "COUNT" parameter are derived from a set of linear equations defined by the implemented LFSR. The care bits of a respective block are reproducible from the SEED parameter and the COUNT parameter. The don't care bits of the respective block are assigned values on a pseudo-random basis according to the characteristics of the LFSR. After a SEED parameter and a COUNT parameter are determined for each block, the stimulus patterns are transformed into test patterns that consist solely of binary symbols, instead of ternary symbols (i.e., 0, 1, or X). The details of compression and decompression of pattern data according to an LFSR algorithm will be discussed in greater detail below. Also, it is noted that because a larger LFSR may be implemented on the ATE to perform the decompression, high compression ratios can be achieved as the data associated with the COUNT parameters become negligible. Also, memory "throttling" (as will be discussed below) may occur to increase the effectiveness of the compression scheme.

In another embodiment, step 104 is performed using run length encoding. In this embodiment, a repeat fill operation is applied to stimulus patterns to assign values to the don't care bits. This assignment generates test patterns that consist solely of binary symbols. In one embodiment, each don't care bit is assigned the value of the most immediately preceding care bit. After performing the repeat fill operation, the patterns are run length encoded using variable length code words that identify the beginning and ending of each code word. By identifying the code words in this manner, the compressed data may be decompressed in parallel as will be discussed in greater detail below. Additionally, variable run-length codes may be employed. The variable length codes enable superior compression ratios as compared to repeat count instructions. Furthermore, the run-length encoding further improves the interface between the ATE and the on-chip DFT functionality. Specifically, if the DFT functionality is processing a set of bits from the ATE, idle cycles typically are employed by the ATE. Using run-length encoding, the idle cycles are not required to be stored in ATE memory and can be generated concurrently with the processing by the DFT functionality.

In step 105, fault simulation is performed using the compacted patterns that have values assigned to the don't care bits as performed by step 104. Faults that are addressed by the patterns are removed from the fault list.

After performing the fault simulation, expected results are simulated for each pattern (step 106). When a test pattern is applied to a circuit, certain resulting outputs or states of logical elements of the circuit will be unknown due to floating buses, bus contention, and/or the like. For example, an expected result may include the following sequence "01001XXX101XX," where "0" defines a bit that should be a zero in the result of the test, "1" defines a bit that should be set to one in the result of the test, and "X" represents a bit that could be set to either a one or zero in the result of the test. A mask data stream may be defined to address unknown values. Specifically, the mask data stream may be used to cause received test data associated with the unknown states to be mapped to a known value (e.g., "0").

In step 107, the expected results and the mask data stream are compressed using, for example, run length encoding. Also, result signatures may be built by accumulating expected results over multiple cycles of a fixed window. Thereby, result signatures may be generated and compared against similarly accumulated result test data after application of the mask data stream. The comparison may function in a manner similar to cyclic redundancy codes (CRC) or checksums to determine whether a particular window passes or fails. Additional details regarding mask data streams and result signatures may be found in U.S. patent Ser. No. 10/308,323 entitled "SYSTEM AND METHOD FOR TESTING CIRCUITRY USING AN EXTERNALLY GENERATED SIGNATURE," filed Dec. 3, 2002, which is incorporated herein by reference.

In step 108, the compressed patterns, compressed expected results, and result signatures are stored in a suitable format to facilitate subsequent testing of circuits using ATE.

Known LFSRs are typically implemented in hardware using connected set 200 of flip-flops as shown in FIG. 2. During operation of the LFSR, the value of each flip-flop is provided to the next adjacent flip-flop and an XOR operation is performed for each feedback tap. Other implementations can be employed such as internal and external LFSRs. The output value of the LFSR is typically the value of the last flip-flop. In general, an LFSR is characterized by its length "n" and by the polynomial vector of size "n" that describes the feedback taps and their locations. When operated, an LFSR generates a bit stream that is defined by its length and its characterizing polynomial. The bit stream is cyclic, i.e. a single unique pattern is repeated by continuously operating the LFSR. The length of the unique pattern (referred to as a pseudo-random pattern) is maximized by selecting a primitive polynomial (a non-factorable polynomial) as the characterizing polynomial. Also, when an LFSR is initialized, the flip-flops may be initiated to respective logical states. The bit pattern used to initialize the logical states is referred to as a "SEED."

Known on-chip decompression techniques have used LFSRs to generate a single test pattern from a single SEED value for application to scan-chains for circuit testing. Specifically, it is generally possible to find a SEED value that, when loaded in the LFSR, will cause the LFSR to generate a bit stream that reproduces the care bits of a given stimulus pattern. The values of the don't care bits are assigned values according to the pseudo-random nature of the LFSR. Known implementations of LFSRs are constrained to ensure that all patterns can be generated by the LFSRs. Examples of the constraints include using a number of overhead bits to prevent linear dependencies and limiting the amount of compaction of patterns to limit the ratio of care bits to don't care bits. Because of the constraints imposed by known on-chip decompression LFSRs, test time potentially may increase. For on-chip compression, this potential test time increase is prevented by fanning out to multiple scan chains. However, this approach does not work if compression is implemented on ATE thereby raising a new issue that has not been previously addressed.

As previously discussed, the use of an over-clocking architecture for the LFSR appreciably reduces the probability of linear dependencies and, hence, increases the amount of compression. Moreover, representative embodiments employ an LFSR compression algorithm that differs appreciably from known LFSR algorithms. LFSR compression according to one representative embodiment generates test data for linear dependent test cycles without conflicting logic bit values and linear independent test cycles thereby increasing the compression ratio.

FIG. 3 depicts a flowchart for compressing pattern data for decompression by an LFSR according to representative embodiments. In step 301, a matrix is created by including, within the matrix, linear equations defined by the LFSR. The equations used in the matrix are defined by the output cycles of the LFSR that correspond to positions of the care bits of the pattern data. In step 302, an attempt is made to solve the matrix against the values of the respective care bits to determine a SEED parameter that defines the initial values of the flip-flops of the LFSR so that the care bits are reproduced by the LFSR. The attempt to solve the matrix may utilize Gaussian elimination or Gauss-Jordan elimination. Based upon the attempt to solve the matrix, a logical determination (step 303) is made upon whether the maximum number of care bits that can be encoded using a single SEED parameter has been determined. The maximum number of care bits is determined by the occurrence of a linear dependency in the linear equations associated with a care bit that possesses a conflicting logic value. If the maximum number of care bits has not been determined, the process flow returns to step 301 where a matrix is created using a different number of equations corresponding to a different number of care bits. If the maximum number of bits has been identified, the process flow proceeds from step 303 to step 304. In step 304, a block of stimulus data associated with the maximum number of care bits is represented by the SEED parameter determined by the solution of the matrix and a COUNT parameter defining the length of the block. Additionally, the search process shown in FIG. 3 could be expedited using a binary search.

FIG. 4 depicts another flowchart for compressing pattern data for decompression by an LFSR that does not involve matrix inversion. In step 401, the COUNT parameter is incremented. In step 402, the next bit in a stimulus pattern or a set of stimulus patterns is selected. In step 403, a logical determination is made to determine whether the selected bit is a care bit. If not, the process returns to step 401. Specifically, if the selected bit is a don't care bit, the don't care bit may be encoded using the current SEED parameter by simply increasing the COUNT parameter.

If the selected bit is a care bit, the process flow proceeds from step 403 to step 404. In step 404, an equation is generated for the respective LFSR cycle as defined by the characterizing polynomial of the LFSR. In step 405, a logical determination is made to determine whether the generated equation is linear dependent on previously generated equations (a linear dependency refers to the occurrence of a generated equation that is linear dependent on one or several previously generated equations). If the generated equation is not linear dependent on previously generated equations, the process flow proceeds from step 405 to step 406. In step 406, the SEED parameter is refined based upon the newly generated equation. Specifically, when the generated equation is linear independent, it is known that a SEED parameter can be determined to generate the currently selected care bit and prior care bits. From step 406, the process flow returns to step 401.

If it is determined that the generated equation is linear dependent, the process flow proceeds from step 405 to step 407. In step 407, a logical determination is made to determine whether the current care bit conflicts with the output of the LFSR for the corresponding cycle using the current SEED parameter by incrementing the COUNT parameter. If the selected care bit does not conflict, the process flow returns to step 401. By encoding linear dependent test cycles without conflicting and independent test cycles into a single pair of SEED and COUNT parameters, multiple test patterns may be encoded for application to a circuit over multiple clock cycles of the circuit. If the selected care bit does conflict, the process flow proceeds from step 407 to step 408. Specifically, because the generated equation is linear dependent and the corresponding care bit is conflicting, no further compression may be achieved. Thus, the portion of the stimulus data up to the currently selected care bit is encoded using the current SEED and COUNT parameters.

The process flow of FIG. 4 may occur more efficiently than the process flow of FIG. 3. Specifically, Gaussian elimination and Gauss-Jordan elimination require inverting a matrix each time that an additional care bit is encountered. Matrix inversion is a relatively processor intensive task. However, the process flow of FIG. 4 requires determining whether the equation for the current LFSR cycle is linear dependent which is a much less processor-intensive task than matrix inversion. Accordingly, a set of stimulus patterns, that requires several hours to be compressed using the process flow of FIG. 3, may only require minutes to be compressed using the process flow of FIG. 4.

Figure 5:
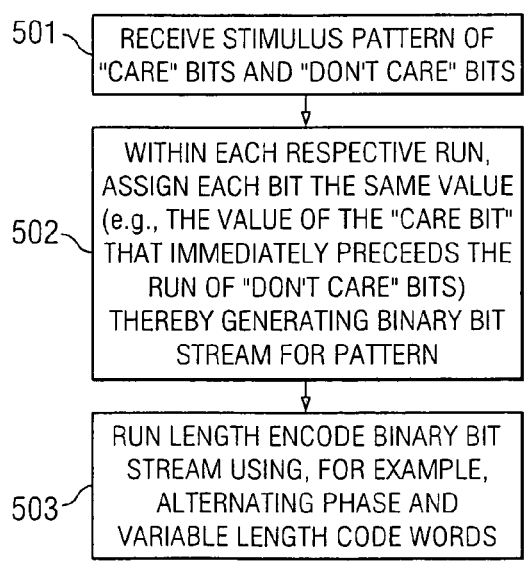
FIG. 5 depicts a flowchart for encoding test data using run length encoding according to one representative embodiment.

FIG. 5 depicts a flowchart for performing pattern compression using run length encoding according to representative embodiments. In step 501, a stimulus pattern is received that includes a plurality of care bits and don't care bits. Because stimulus patterns typically possess a relatively low number of care bits relative to the number of don't care bits, stimulus patterns frequently contain runs of don't care bits. A run is the sequence of consecutive occurrences of the same value. In step 502, each bit within respective runs of don't care bits are assigned the same value. In representative embodiments, each run of don't care bits is replaced by the same value such as the value of the care bit that immediately precedes the run of the don't care bits. Also, isolated don't care bits (single don't care bits preceded and followed by respective care bits) are assigned the value of the immediately preceding care bit. For example, the stimulus patterns given by "01001 XXX0X0X01101" may be processed to form the binary bit stream "01001111000001101." Processing a stimulus pattern in this manner is referred to as "repeat-filling" and is performed by currently known EDA/ATPG software tools. Known software tools perform repeat-filling to minimize the number of binary transitions in the test patterns for the purpose of minimizing power dissipation. In this embodiment, compression and decompression of test patterns may occur without requiring modification of known EDA/ATPG software tools.

In step 503, each run of binary symbols in the repeat-filled binary stream is run length encoded using, for example, alternating phase and variable length code words. Binary run length encoding refers to encoding a binary stream where runs of consecutive occurrences of the same binary value are replaced by a code word that represents the length of the run. For example, a run of twelve "zeros" could be replaced by a code word that represents a runlength of twelve. In a binary runlength encoding scheme, it is not necessary to define the specific binary value (either "zero" or "one") that is repeated in a run. Specifically, each run is necessarily followed by the opposing value, i.e., a run of "zeros" is always followed by at least one "one" and a run of "ones" is always followed by at least one "zero" when the encoding scheme is suitably defined. Thus, by defining the first occurrence of a binary symbol in the run length encoded test pattern, all of the symbols of run length codes are determined by alternating between "zero" and "one" in relation to the first binary symbol of the test pattern. In representative embodiments, variable length code words are used to run length encode repeat-filled test patterns.

In one representative embodiment, Fibonacci codes are employed to implement a parallel decompression architecture. Fibonacci codes are based on the Fibonacci series where each value is the sum of the previous two values. No Fibonacci code contains two successive binary "ones." Also, each Fibonacci code begins with the value "one." The beginning of a bit stream may be initiated using two "ones." Also, an additional "one" is added to the most significant bit (MSB) of each Fibonacci code in the bit steam. Using these properties, the beginning and end of each Fibonacci code may be identified by detecting the occurrence of two consecutive "ones" in the Fibonacci encoded bit stream (i.e., without decoding the code word). Furthermore, it is noted that the detection of an individual Fibonacci code does not require the extraction of the represented value.

Figure 6:
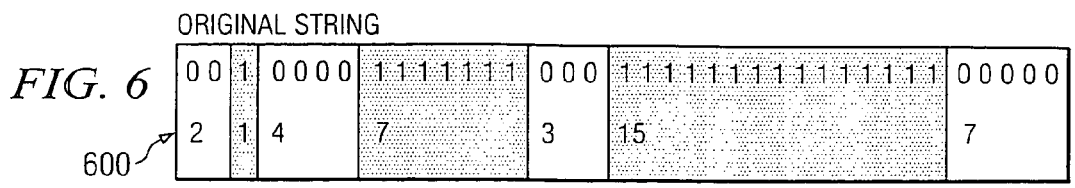
FIG. 6 depicts repeat filled test data.
Figure 7:
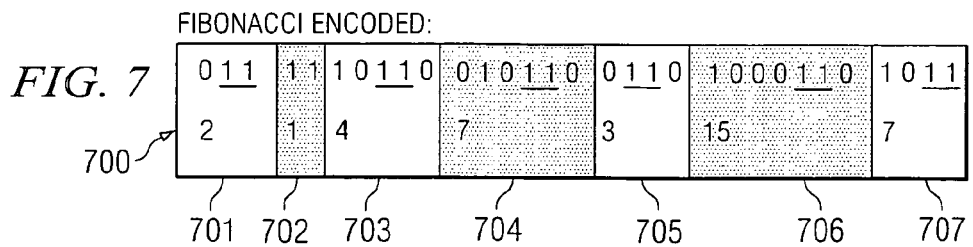
FIG. 7 depicts run length encoding of the repeat filled test data shown in FIG. 6 according to one representative embodiment.
Figure 8:
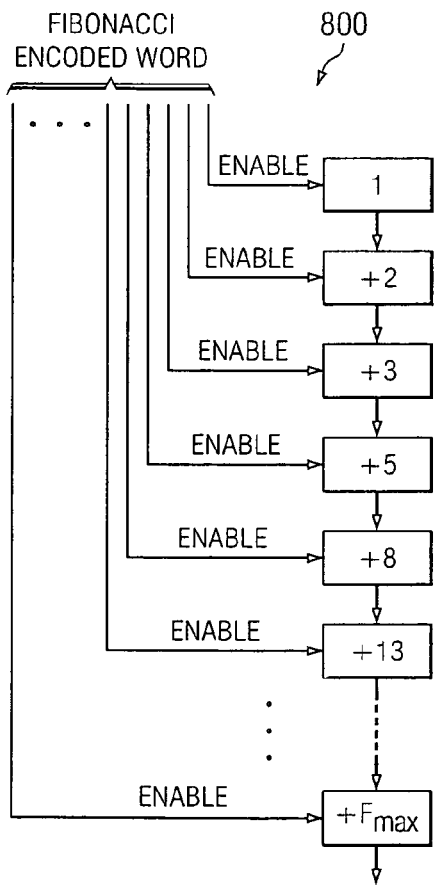
FIG. 8 depicts a parallel hardware architecture for decoding run length encoded test data according to one representative embodiment.

To illustrate alternating phase run length encoding and Fibonacci codes, reference is made to FIGS. 6 and 7. FIG. 6 depicts bit stream 600 that contains a plurality of runs of binary values. Specifically, bit stream 600 includes a run of two "ones," a run of a single "zero," a run of four "zeros,"

a run of seven "ones," a run of three "ones," a run of fifteen "ones," and a run of seven "zeros." FIG. 7 depicts Fibonacci encoded bit stream 700 where each run length (two, one, four, seven, three, fifteen, and seven) is represented by a corresponding Fibonacci code that has an additional "one" appended to the MSB bit of the code. The beginning and end points of each Fibonacci code may be determined in reference to symbols 701, 702, 703, 704, 705, 706, and 707 that each are associated with the occurrence of two consecutive "ones." The end point of each Fibonacci code>1 is immediately detected by the presence of "011" (symbols 701, 703, 704, 705, 706, and 707). The end point of the Fiboannacci code=1 is given by "11." The end point of this Fibonacci code is detected by using the end point of the most immediately preceding Fibonacci code>1. By representing the compressed test patterns in this manner, parallel Fibonacci decoder architecture 800 of FIG. 8 may be employed to run length decode compressed test patterns in parallel to support the relatively demanding timing criteria of ATE.

In another representative embodiment, the COUNT parameters generated from LFSR compression are encoded utilizing the variable length Fibonacci codes described above with respect to FIG. 7. Specifically, a COUNT parameter in an ordinary binary format is replaced by a Fibonacci code that represents the same value. Likewise, result mask data may be run length encoded and decoded in parallel by an ATE using the Fibonacci codes discussed above with respect to FIGS. 6 and 7. Although Fibonacci codes have been described for one representative embodiment, decompression hardware implementations may based on other variable length codewords depending upon the frequency requirements associated with a particular application.

Figure 9:
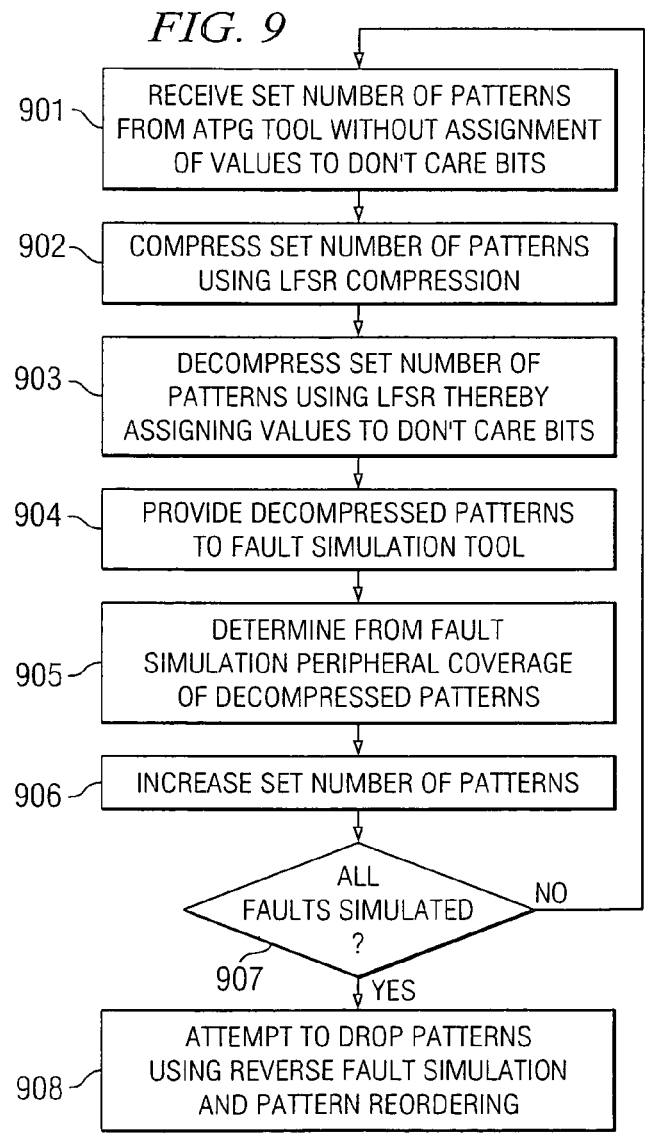
FIG. 9 depicts another flowchart for processing test patterns according to one representative embodiment.

FIG. 9 depicts a flowchart for compressing test pattern data according to one representative embodiment. In step 901, a set number of patterns are received from an ATPG tool without assignment of values to the don't care bits. In step 902, the set number of patterns are compressed using LFSR compression according to representative embodiments. Specifically, a SEED parameter and a COUNT parameter are generated for strings of test data that do not possesses linear dependencies with conflicting values for care bits at the location of the linear dependencies. In step 903, the compressed patterns are then decompressed using the respective LFSR to determine the values that are assigned to the don't care bits by the LFSR using the respective SEED and COUNT parameters. In step 904, the decompressed patterns are provided to a fault simulation tool. In step 905, from the fault simulation tool, the peripheral coverage of the decompressed patterns is determined. Specifically, states that are stimulated by the pseudo-random assignment of values to the don't care bits are identified. In step 906, the set number of patterns may be increased if appropriate. A relatively low number of patterns (e.g., ten patterns) may be compressed during initial stages. The set number of patterns may be periodically increased during the process flow until a much larger number of patterns (e.g., 100) are compressed during a single processing stage. In step 907, a logical determination is made to determine whether all faults are stimulated using the compressed patterns. If not, the process flow returns to step 901, where another set number of patterns are received from the ATPG using the increased number of patterns. If all faults are stimulated, the process flow proceeds to step 908. In step 908, an attempt is made to drop patterns using reverse fault simulation and pattern reordering.

By increasing the number of patterns during the compression process, representative embodiments provide a number of advantages. For example, faults may be categorized into "easily detectable" faults and "difficult" faults. Easily detectable faults may be stimulated by a relatively large number of patterns. Accordingly, when compression of test patterns occurs according to representative embodiments, peripheral coverage of the decompressed patterns is highly probable for a relatively small number of patterns. However, after a number of patterns are processed, a substantial portion of the easily detectable faults are already covered and, hence, the amount of peripheral coverage decreases relative to the number of patterns processed. Thus, by increasing the set number of patterns, the processor intensive tasks of compression, decompression and fault simulation may be reduced.

As previously discussed, in one representative embodiment, LFSR encoding using a single pair of SEED and COUNT parameters is limited by the occurrence of a care bit associated with an LFSR equation that is linear dependent upon an LFSR prior equation or equations where the value of the care bit conflicts with the value of the care bit(s) associated with the prior equation(s). One representative embodiment addresses this limitation by reducing the probability of the occurrence of linear dependencies for care bits. Specifically, an over-clocking architecture is used to reduce the probability of linear dependencies.

FIG. 10 depicts four-bit LFSR 1000 with feedback taps and FIG. 11 depicts four-bit LFSR 1100 with "2-times" over-clocking that can be derived from LFSR 1000. Due to the over-clocking nature of LFSR 1100, LFSR 1100 includes feedforward and feedback taps. Because LFSR 1100 employs over-clocking the probability of linear dependencies occurring during compression of test data using LFSR re-seeding is reduced relative to LFSR 1000.

A formal synthesis methodology may be employed to derive an over-clocking architecture from an arbitrary LFSR. Specifically, the characterizing polynomial of the LFSR is determined. The characterizing polynomial is "1100" for LFSR 1000 as seen in FIG. 10. A square transition matrix is defined using the characterizing polynomial. For example, square transition matrix 1200 is depicted in FIG. 12 for LFSR 1000. The bottom row (shown as row 1201) of the square transition matrix is the characterizing polynomial of LFSR 1000. The first column with the exception of the last value (shown as 1202) is filled with zeros. The remaining values (shown as 1203) are filled using a square diagonal matrix.

The square transition matrix is raised to the power as defined by the desired degree of over-clocking. For example, FIG. 13 depicts matrix 1300 that is derived by raising matrix 1200 to the $2^{nd}$ power. Matrix 1300 defines the feedforward and feedback connections. Specifically, each element i, j of the matrix defines whether a connection is employed between the $i^{th}$ flip-flop of the LFSR and the $j^{th}$ flip-flop of the LFSR. XOR gates are used for elements that possess multiple feedback and/or feedforward connections. Matrix 1300 results in the connections shown in LFSR 1400 of FIG. 14. The topology of LFSR 1400 may be simplified by reordering the positions of the flip-flops to result in LFSR 1100 as shown in FIG. 11.

The synthesis methodology for designing over-clocking LFSRs may be employed for LFSRs of any length and for any degree of over-clocking desired subject to hardware constraints. In one representative embodiment, LFSRs of lengths of 64-bits and 128-bits with 10-times over-clocking are employed to reduce the probability of linear dependencies from occurring during LFSR-based compression of test pattern data.

Figure 15:
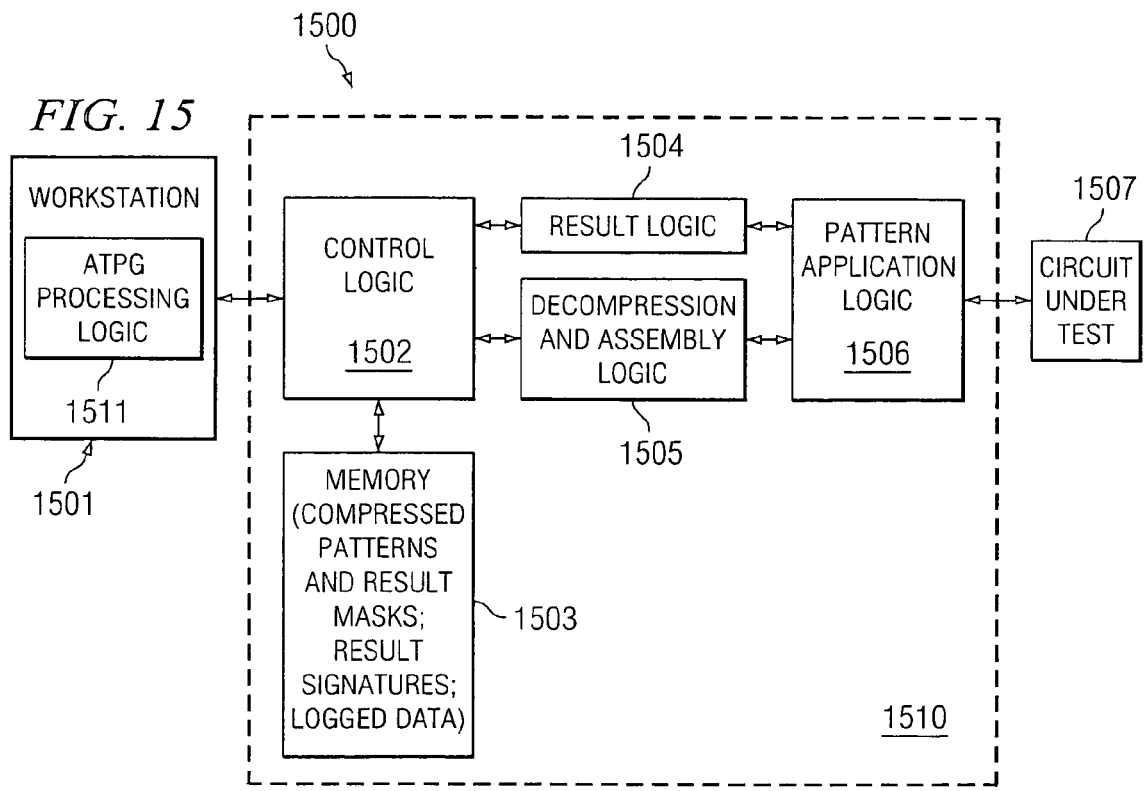
FIG. 15 depicts an automated test equipment (ATE) system that employs real-time decompression of test pattern data.

FIG. 15 depicts automated test equipment (ATE) system 1500 according to one representative embodiment. ATE 1510 applies test patterns to circuit under test 1507 in real-time to verify the functionality of circuit 1507. ATE 1510 may be communicatively connected to workstation 1501 or another suitable computer system. Workstation 1501 may include suitable executable instructions or code defining automatic test pattern processing according to representative embodiments (shown as ATPG processing logic 1511). Workstation 1501 may download compressed test pattern data, compressed mask data, and expected result signatures generated by ATPG processing logic 1511 to memory 1503 of ATE 1510. ATE 1510 may communicate test result data to workstation 1601 to facilitate post-processing of the test data if desired.

During operation of ATE 1510, control logic 1502 may retrieve appropriate compressed patterns from memory 1503 and provide the compressed patterns to decompression and assembly logic 1505. Decompression and pattern assembly logic 1505 may include an LFSR for decompressing test patterns according to SEED and COUNT parameters. The LFSR may be implemented using a relatively large number of flip-flops characterized by a non-primitive polynomial. Furthermore, the LFSR may include feedforward and feedback taps. By implementing the LFSR in this manner, relatively highly compacted test patterns may be applied to circuit under test 1507.

Additionally or alternatively, decompression and pattern assembly logic 1505 may perform decompression according to a run length encoding scheme. For example, Fibonacci codes may be segmented and then decoded in parallel. By decoding the code words in parallel, a sufficiently high data rate may be achieved to support the real-time application of test data to circuit under test 1507. For example, the serialization or assembly of data from parallel Fibonacci decoders may enable ATE 1510 to provide test data at a gigahertz or greater bit rate to enable a circuit to be tested in real-time.

The decompressed test data is provided from decompression and pattern assembly logic 1505 to pattern application logic 1506. Pattern application logic 1506 provides the test data to appropriate pins or other connections of circuit under test 1507. Pattern application logic 1506 further scans out result data from circuit under test 1507. The result data is provided to result logic 1504. Result logic 1504 applies a data mask to the result data. The data mask may be decompressed by performing parallel decoding of Fibonacci codes. Result logic 1504 accumulates the masked result data over a window of cycles to form result signatures. The computed result signatures are compared to expected result signatures. If the result signatures do not match, all of the result data for the failing window is saved to memory 1503 for post-processing by workstation 1501. In contrast, on-chip compression techniques are unable to identify a failing cycle directly. Such techniques re-run a failing test without compression so that all test responses can be logged. Representative embodiments do not require such additional testing and thereby enable circuit testing to occur in a more efficient manner than on-chip decompression techniques. On-chip output compression techniques based upon compactor trees do not exhibit this issue.

Figure 16:
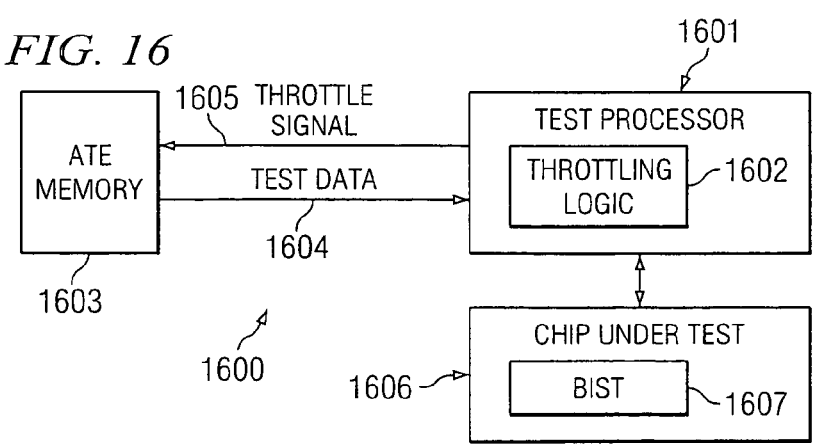
FIG. 16 depicts an ATE that controls the download of data from ATE memory using a "throttling" capability.

FIG. 16 depicts ATE 1600 that uses a "throttling" capability to control the retrieval of test data from ATE memory 1603 according to one representative embodiment. Specifically, test processor 1601 obtains test data 1604 from ATE memory 1603 for expansion and communication to chip under test 1606. Throttling logic 1602 of test processor 1601 causes the communication of test data 1604 to temporarily cease at appropriate times. Specifically, throttle signal 1605 is communicated to the ATE memory controller to halt the communication of test data 1604. The ability to cease the download of data from ATE memory during operation of ATE 1600 is advantageous for a number of situations.

In particular, if an ATE is used in combination with on-chip decompression, a recurring issue is the fact that the data stream from the ATE is not stopped during decompression of a set of bits on-chip. Therefore, even though the theoretically high compression ratio could be achieved on-chip, in practice, the compression ratio is limited because the ATE cannot be stopped. Idle cycles could be stored in ATE memory 1606 to address the inability to halt ATE operations. The necessity of storing idle cycles reduces the effectiveness of the compression scheme. For example, a single combination of a SEED parameter and a COUNT parameter could be expanded into 2048 bits (or more depending upon the implementation of the LFSR). In on-chip decompression, the combination would result in a large number of idle data bits being retrieved from memory. In contrast, some representative embodiments may employ the "throttling" capability during LFSR expansion. Specifically, during throttling operations, representative embodiments cease retrieving test data from memory while other operations occur. By doing so, the amount of data stored in ATE memory 1603 is reduced.

Moreover, the throttling capability may be used for other situations. For example, built-in self-test (BIST) circuitry 1607 residing in chip under test 1606 may impose delays during a number of operations. During such times, useful test data is not communicated between the ATE and chip under test 1606. As previously noted, due to the design of ATEs, it is not possible to stop the communication of bits to chip under test 1606. Specifically, bits continue to be communicated through the interface to the chip, even though those bits are not used for testing purposes. Idle bits could be stored in ATE memory to address these situations. This is a recurring problem in memory test. Representative embodiments enable the omission of storing such idle bits in ATE memory 1603 using the throttling capability.

It is noted that conventional repeat count instructions (instructions causing a value to be repeated for multiple cycles) could be used to reduce the number of idle cycles stored in ATE memory. However, runlength compression techniques enables finer granularity of runlengths, less overhead per runlength, and therefore achieves higher compression ratios.

Figure 17:
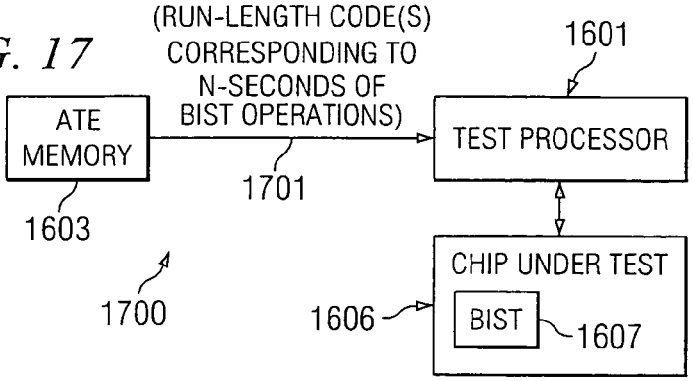
FIG. 17 depicts an ATE that employs run length codes to address on-chip testing delays.

FIG. 17 depicts ATE 1700 that addresses BIST delays and other similar situations according to one representative embodiment. As shown in FIG. 17, test data 1701 is communicated from ATE memory 1603 to test processor 1601. Test processor 1601 expands the received data and communicates the expanded data to chip under test 1606. For the sake of illustration, it is assumed that chip under test 1606 employs BIST circuitry 1607 that imposes N-seconds of delay at predefined points. Test data 1701 is run length encoded to address the delay. Specifically, a run length code or codes may be placed in test data 1701 to generate a sufficient amount of decompressed data to correspond to the N-seconds of delay. The use of run length codes to address such delays enables greater compression performance than the use of idle cycles.

Figure 18:
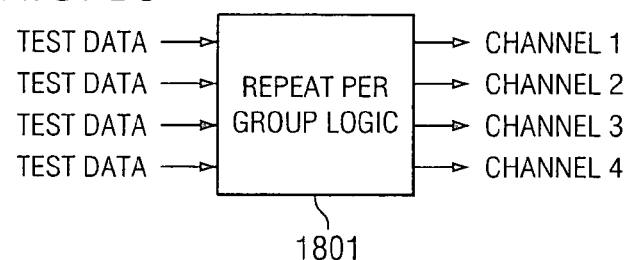
FIG. 18 depicts an ATE subsystem that performs per group processing.

FIG. 18 depicts ATE subsystem 1800 that employs repeat per group processing. Specifically, test data to be applied to respective pins is received by repeat per group logic 1801. Repeat per group logic 1801 is a shared resources that causes test data to be repeated across the multiple channels. For example, if the bit pattern "0001" to be applied to the pins associated with channels 1, 2, 3, and 4 is repeated multiple times, a repeat count instruction could be applied by repeat per group logic 1801 causing the first occurrence of the bit pattern to be repeated for multiple cycles. The difficulty associated with the shared resource architecture is the dependency of the test data across multiple channels. Specifically, if a bit pattern of "1001" occurs after the bit pattern of "0001," a repeat count instruction could not be used because of the change in a single bit.

Figure 19:
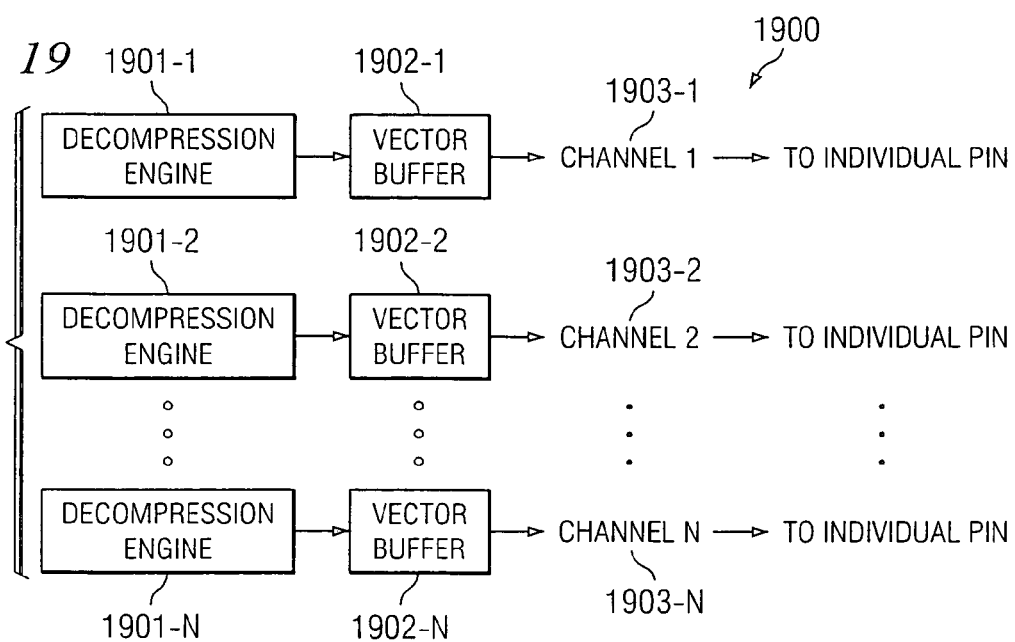
FIG. 19 depicts an ATE subsystem that performs per pin processing to occur according to one representative embodiment.

FIG. 19 depicts ATE subsystem 1900 that enables per pin processing to occur according to one representative embodiment. In per pin processing, decompression functionality is employed for each relevant pin of the circuit-under-test that receives test data. As shown in FIG. 19, a plurality of decompression engines 1901-1 through 1901-N are provided. Each decompression engine 1901 independently receives compressed test pattern data and generates decompressed test pattern data. For example, each of engines 1901 may include an LFSR and related circuitry to generate decompressed test data. Alternatively, each of engines 1901 may include parallel run length decoders to generate decompressed test data. The test data may be buffered in vector buffers 1902-1 through 1902-N. The data stored in vector buffers 1902-1 through 1902-N may be communicated through channels 1903-1 through 1903-N to respective pins of the circuit-under-test under the control of suitable test data application logic. The ability to employ per pin processing enables a greater degree of flexibility for the compression encoding and, hence, a greater degree of compression performance.

Some representative embodiments may provide a number of advantages. Some representative embodiments are advantageous as compared to on-chip compression techniques, because performing decompression with the ATE does not require any modification to the design of a circuit to be tested. Accordingly, some representative embodiments do not increase the risk associated with bringing the design of the circuit to completion. Furthermore, some representative embodiments enable highly compacted test patterns to be compressed thereby maintaining test times within acceptable levels. Some representative embodiments are advantageous, because encoding linear dependent test data without conflicting values in addition to linear independent test data increases the achieved amount of compression. The greater amount of compression enables highly compacted test sets to be encoded thereby decreasing the amount of test time. Additionally, some representative embodiments enable decompression to occur in real-time concurrently with the application of test data to a circuit under test by an ATE by utilizing a suitably implemented LFSR and/or parallel run length decoders. Specifically, a bit stream rate of 400 MHz or greater may be achieved using some representative embodiments.

What is claimed is:

1. An automated test equipment (ATE) device for testing a circuit, comprising:
   memory that stores test patterns in a compressed format that includes seed parameters and corresponding count parameters;
   a linear feedback shift register (LFSR) for decompressing said test patterns and generating a bit stream;
   logic for controlling said LFSR, wherein said logic for controlling loads said LFSR with binary values according to a respective seed parameter and operates said LFSR to generate a number of bits that equals a corresponding count parameter associated with the respective seed parameter;
   and logic for applying a bit stream from said LFSR to said circuit.

2. The ATE device of claim 1 wherein said count parameters identify bits associated with a linear dependency of said LFSR.

3. The ATE device of claim 1 wherein said LFSR is characterized by a non-primitive polynomial.

4. The ATE device of claim 1 wherein said LFSR includes feedback and feedforward connections.

5. The ATE device of claim 1 wherein said test patterns stored in compressed format include at least one seed parameter and a respective count parameter that encode multiple test patterns to be applied over multiple clock cycles of the circuit.

6. The ATE device of claim 1 wherein said logic for applying applies said bit stream at a bit rate of at least one gigahertz to said circuit.

7. The ATE device of claim 1 wherein said count parameters are encoded using variable length codes.

8. The ATE device of claim 1 wherein said LFSR possesses a length of at least 64 bits.

9. A method of operating automated test equipment (ATE), comprising:
   storing compressed test patterns in memory of said ATE, wherein said compressed test patterns comprise seed parameters and corresponding count parameters;
   retrieving a respective seed parameter from said compressed test patterns;
   initializing a linear feedback shift register (LFSR) in said ATE according to said retrieved seed parameter;
   operating said LFSR for a number of cycles defined by a respective count parameter to generate a bit stream; and
   applying said generated bit stream by said ATE to a circuit under test.

10. The method of claim 9 wherein said LFSR is characterized by a non-primitive polynomial.

11. The method of claim 9 wherein said LFSR comprises feedforward and feedback taps.

12. The method of claim 9 wherein said operating generates plurality of test patterns for said circuit under test from said retrieved seed parameter and said respective count parameter.

13. The method of claim 9 wherein each of said count parameters is associated with a linear dependency of said LFSR.

14. The method of claim 9 further comprising:
   causing retrieval of test data from memory of said ATE to temporarily halt.

15. The method of claim 14 wherein said causing retrieval of test data to temporarily halt occurs in response to a delay associated in self-test circuitry of said circuit under test.

16. A method for generating test patterns, comprising:
   receiving stimulus patterns for a circuit from an automated test pattern generator, wherein said stimulus patterns include care bits and don't care bits;
   generating linear equations defined by positions of said care bits relative to operation of a linear shift feedback register (LFSR); and
   determining seed parameters and count parameters from said linear equations and said care bits, wherein each seed parameter defines a set of initial states to be loaded into said LFSR to generate at least a subset of said care bits and each count parameter is associated with a location of a linear dependency in said linear equations that corresponds to a conflicting value of a care bit.

17. The method of claim 16 further comprising:

generating binary test data by applying at least one of said seed parameters to said LFSR to generate a number of bits defined by a respective count parameter;

applying said binary test data to a fault simulator;

identifying faults stimulated by peripheral coverage of said binary test data; and dropping said faults stimulated by said peripheral coverage from a fault list.

18. The method of claim 17 further comprising:

repetitively performing said receiving, generating linear equations, determining, generating binary test data, applying, identifying, and dropping using progressively increasing numbers of stimulus patterns.

19. The method of claim 16, wherein said determining includes performing Gaussian elimination upon a matrix defined by said linear equations.

20. The method of claim 16, wherein said determining includes determining whether one of said linear equations is a linear combination of prior ones of said linear equations.

21. The method of claim 20 further comprising:

determining whether said one of said linear equations is associated with a care bit that possesses a value that conflicts with a value of another care bit associated with said prior ones of said linear equations.

22. The method of claim 21 further comprising:

setting a value of one of said count parameters according to a determination that said one of said linear equations is associated with a care bit that possesses a conflicting value.

23. The method of claim 16 wherein said LFSR is a non-primitive polynomial.

24. The method of claim 16 wherein said LFSR comprises feedback and feedforward connections.

25. The method of claim 16 wherein said LFSR has a length of at least 64 bits.

* * * * *